(12) United States Patent
Klee et al.

(10) Patent No.: US 6,784,600 B2
(45) Date of Patent: Aug. 31, 2004

(54) ULTRASONIC MEMBRANE TRANSDUCER FOR AN ULTRASONIC DIAGNOSTIC PROBE

(75) Inventors: Mareike Katharine Klee, Hückelhoven/Brachelen (DE); Georg Schmitz, Wachtberg (DE); John D. Fraser, Woodinville, WA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 155 days.

(21) Appl. No.: 10/137,491

(22) Filed: May 1, 2002

(65) Prior Publication Data

US 2003/0205947 A1 Nov. 6, 2003

(51) Int. Cl.[7] .............................................. H01L 41/047
(52) U.S. Cl. ....................... 310/366; 310/365; 310/348; 367/160; 367/161; 367/162; 367/163; 367/164; 367/165; 252/62.9 R
(58) Field of Search ................................. 310/324, 326, 310/327, 348, 365, 366; 367/160–165; 252/62.9 R (56) References Cited

U.S. PATENT DOCUMENTS

| | | | | |
|---|---|---|---|---|
| 4,401,910 A | * | 8/1983 | Beerman | 310/369 |
| 4,452,084 A | * | 6/1984 | Taenzer | 73/609 |
| 5,309,411 A | * | 5/1994 | Huang et al. | 367/140 |
| 5,433,917 A | | 7/1995 | Srivastava et al. | 419/22 |
| 5,619,476 A | | 4/1997 | Haller et al. | 367/181 |
| 5,870,351 A | | 2/1999 | Ladabaum et al. | 367/174 |
| 5,894,452 A | | 4/1999 | Ladabaum et al. | 367/163 |
| 6,291,927 B1 | | 9/2001 | Percin et al. | 310/224 |
| 6,329,739 B1 | * | 12/2001 | Sawano | 310/313 R |
| 6,498,422 B1 | * | 12/2002 | Hori | 310/344 |
| 6,548,937 B1 | * | 4/2003 | Klee et al. | 310/324 |

FOREIGN PATENT DOCUMENTS

JP     60-59899     *  4/1985   .................. 310/334

OTHER PUBLICATIONS

Jin et al., "Fabrication and Characterization of Surface Micromachined Capacitive Ultrasonic Immersion Transducers," IEEE Journ. of Microelec., vol. 8, No. 1, Mar. 1999, pp. 100–114.
Percin et al., "Micromachined 2–D Array Piezoelectrically Actuated Flextensional Transducers," 1997 IEEE Ultrasonics Symposium, pp. 959–962.
Bernstein et al., "Advanced MEMS Ferroelectric Ultrasound 2D Arrays," 1999 IEEE Ultrasonics Symposium, pp. 1145–1153.
Percin et al., "Piezoelectrically Actuated Transducer and Droplet Ejector," 1996 IEEE Ultrasonics Symposium, pp. 913–916.

* cited by examiner

*Primary Examiner*—Thomas M. Dougherty
(74) *Attorney, Agent, or Firm*—W. Brinton Yorks, Jr.

(57) ABSTRACT

The invention is directed towards structures for use with micro-formed membrane ultrasonic transducers, and methods for fabricating the structures. In one embodiment, the transducer includes a planar member having a piezoelectric material and spaced apart electrodes disposed on the planar member and coupled to the piezoelectric material for applying an electric field to the layer, and an acoustic backing member joined to the electrodes. In another embodiment, the transducer includes a planar member having a piezoelectric material that adjoins a semiconductor material, the semiconductor material having monolithically formed active circuits formed in the layer and coupled to the piezoelectric material. In still another embodiment, the transducer includes a planar member having a piezoelectric material, and an acoustic backing member having an adjoining layer of a semiconductor material having monolithically formed active circuits, the active circuits being coupled to the electrodes.

24 Claims, 9 Drawing Sheets

(PRIOR ART)

ULTRASONIC MEMBRANE TRANSDUCER FOR AN ULTRASONIC DIAGNOSTIC PROBE

TECHNICAL FIELD

This invention relates generally to ultrasound diagnostic systems that use ultrasonic transducers to provide diagnostic information concerning the interior of the body through ultrasound imaging, and more particularly, to ultrasonic membrane transducers used in such systems.

BACKGROUND OF THE INVENTION

Ultrasound diagnostic imaging systems are in widespread use for performing ultrasonic imaging and measurements. For example, cardiologists, radiologists, and obstetricians use ultrasonic diagnostic imaging systems to examine the heart, various abdominal organs, or a developing fetus, respectively. In general, imaging information is obtained by these systems by placing an ultrasonic transducer array against the skin of a patient, and actuating one or more elements located within the array to transmit ultrasonic energy through the skin and into the body of the patient. In response to the transmission of ultrasonic energy into the body, ultrasonic echoes emanate from the interior structure of the body. The returning acoustic echoes are converted into electrical signals by the one or more elements in the array, which are transferred to the diagnostic system by a cable coupling the diagnostic system to the transducer array.

Recent advances in software and digital technologies have permitted the development of ultrasound imaging systems of increased flexibility and rapid data processing rates. Consequently, the number of ultrasonic transducer elements within the diagnostic probe has also steadily increased, allowing the development of relatively wide aperture diagnostic probes that yield high lateral resolution.

Acoustic transducers commonly used in ultrasonic diagnostic probes are generally comprised of an array of individual piezoelectric elements formed from a crystalline piezoelectric material by performing a number of meticulous manufacturing steps. For example, prior art acoustic transducer arrays have been formed by bonding a single block of a piezoelectric material to an acoustic backing member having a relatively low acoustic impedance and high acoustic attenuation. The material is then laterally subdivided by cutting or dicing the material to form the fine rectangular elements of the array. Electrical contact pads are deposited on the individual elements using various metallization processes to permit electrical conductors to be coupled to the individual elements of the array. The electrical conductors are generally coupled to the contact pads by a variety of electrical joining methods, including soldering, spot-welding, or by adhesively bonding the conductor to the contact pad.

Although the foregoing manufacturing steps are generally adequate to form acoustic transducer arrays having up to a few hundred elements, larger arrays of elements having smaller element sizes are not easily formed using the foregoing technique. Consequently, various methods used in the fabrication of silicon microelectronic devices have been adapted to produce ultrasonic transducer elements on semiconductor substrates, since these techniques permit the repetitive fabrication of small structures with intricate details. As a result, transducer elements that are much smaller than those attainable using the foregoing method may easily be fabricated in large numbers.

Figure 1:
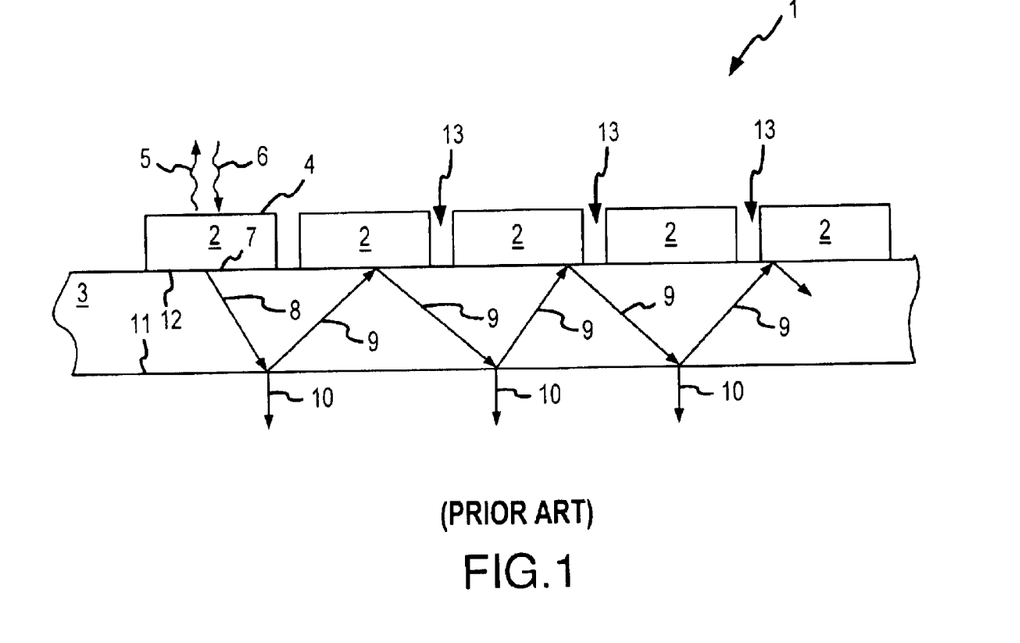
FIG. 1 is a partial cross sectional view of a micro-formed membrane transducer according to the prior art.

FIG. 1 is a partial cross sectional view of a micro-formed membrane ultrasonic transducer array 1 according to the prior art. The array 1 includes a plurality of micro-formed membrane elements 2 positioned on an upper surface 12 of a silicon substrate 3. The elements 2 generally include an upper surface 4 that is spaced apart from a lower surface 7 that abuts the substrate 3. Each element is coupled to a time-varying voltage source through a plurality of electrical interconnections formed in the substrate 3. For clarity of illustration, the voltage source and the electrical interconnections to each of the elements are not shown. When the time-varying excitation voltage is applied to the elements, a vibrational deflection in the upper surface 4 is developed that stems from the electromechanical properties of the element. Accordingly, acoustic waves 5 are generated that radiate outwardly from the upper surface 4 in response to the applied time-varying voltage. The electromechanical properties of the elements similarly allow the elements to be responsive to deflections resulting from acoustic waves 6 that impinge on the upper surface 4.

One disadvantage in the foregoing prior art array 1 is that a portion of the ultrasonic energy developed by the elements 2 may be projected backwardly into the underlying substrate 3 rather that being radiated outwardly in the acoustic wave 5. Consequently, a partial loss of radiated energy from the elements 2 results. Further, when ultrasonic energy is coupled into the underlying substrate 3, the ultrasonic energy propagates into the substrate 3 as an acoustic wave 8 that may be internally reflected at a lower surface 11 of the substrate 3 to form a reflected wave 9 that is directed towards the upper surface 12 of the substrate 3. A plurality of reflected waves 9 may then propagate within the substrate 3 between the upper surface 12 and the lower surface 11. A portion of the energy present in each reflected wave 9 may also leave the substrate 3 through the surface 11, to form a plurality of leakage waves 10. The propagation of acoustic waves 9 in the substrate 3 further permits ultrasonic energy to be cross-coupled between the elements 2 since the waves 9 may be received by other elements 2 in the array 1, thus generating undesirable "cross-talk" signals between the elements 2, as well as other undesirable interference effects. Still further, the internal reflection of waves in the substrate 3 may adversely affect the acceptance angle, or directivity of the array 1.

Various prior art devices have included elements that impede the propagation of waves in the substrate. For example, one prior art device employs a plurality of trenches between the elements 2 that extend downwardly into the substrate 3 to interrupt wave propagation within the substrate 3. A similar prior art device employs a downwardly projecting trench, which is filled with an acoustic attenuation material to at least partially absorb the energy in the reflected waves 9. Although these prior art devices may reduce the undesired lateral wave propagation in the substrate, they also generally limit the advantages inherent in micro-forming the elements 2 by reducing the number of design parameters that may be independently varied. Furthermore, the additional manufacturing steps significantly increase the manufacturing cost of micro-formed transducer arrays.

A further disadvantage associated with the prior art array 1 shown in FIG. 1 is that the array 1 is commonly exposed to a variety of substances, including water, sterilants and coupling gels. Since the elements 2 are micro-formed on the substrate 3, various small recesses may exist on the array 1 where these substances may become lodged. For example, a plurality of recesses 13 may be formed between the elements 2 that may allow the progressive accumulation of contaminants, due to the general inability to adequately clean the small recesses 13 of the array 1. Additionally, surfaces exposed to the substances may be susceptible to corrosion or erosion stemming from this exposure.

Still another disadvantage present in the prior art array 1 is that the array 1 lacks a hard cover surface to protect the array 1. Consequently, the array 1 is generally susceptible to damage resulting from physical impacts, since an impact sustained by the array 1 may damage individual elements 2, as well as the underlying substrate 3 that contains electrical interconnections or other devices.

Accordingly, there is a need in the art for micro-formed ultrasonic arrays that are capable of producing significant reductions in acoustic wave propagation in the underlying substrate. In addition, there is a need in the art for micro-formed ultrasonic arrays that resist contamination and damage from a variety of substances, and are easily cleaned. Still further, there is a need in the art for micro-formed ultrasonic arrays that can resist damage from commonly-encountered physical impacts.

SUMMARY OF THE INVENTION

The invention is directed towards improved structures for use with micro-formed membrane ultrasonic transducer arrays and methods for fabricating the improved structures. In one aspect of the invention, the micro-formed membrane transducer array includes a planar member having a layer of a piezoelectric material and a plurality of spaced apart electrodes disposed on a surface of the planar member and coupled to the layer of piezoelectric material for applying an electric field to the layer, and an acoustic backing member fixedly joined to the plurality of electrodes. In another aspect, the micro-formed membrane transducer array includes a planar member having a layer of a piezoelectric material and an adjoining layer of a semiconductor material, the layer of semiconductor material having a plurality of monolithically formed active circuits formed in the semiconductor layer and coupled to the layer of piezoelectric material, a plurality of spaced apart electrodes disposed on a surface of the planar member and coupled to the active circuits for applying an electric field to the piezoelectric layer, and an acoustic backing member fixedly joined to the plurality of electrodes. In still another aspect, the micro-formed membrane transducer array includes a planar member having a layer of a piezoelectric material, a plurality of spaced apart electrodes disposed on a surface of the planar member for applying an electric field to the piezoelectric layer, and an acoustic backing member having an adjoining layer of a semiconductor material, the layer of semiconductor material having a plurality of monolithically formed active circuits, the active circuits being coupled to the electrodes and fixedly joined to the electrodes at selected sites.

DETAILED DESCRIPTION OF THE INVENTION

The present invention is generally directed to ultrasound diagnostic systems that use ultrasonic micro-formed membrane transducers to provide diagnostic information concerning the interior of the body through ultrasound imaging. Many of the specific details of certain embodiments of the invention are set forth in the following description and in FIGS. 2 through 16 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimension. Further, it is understood that specific or relative dimensions related to the various embodiments, if stated, are not to be considered limiting unless the claims expressly state otherwise.

Figure 2:
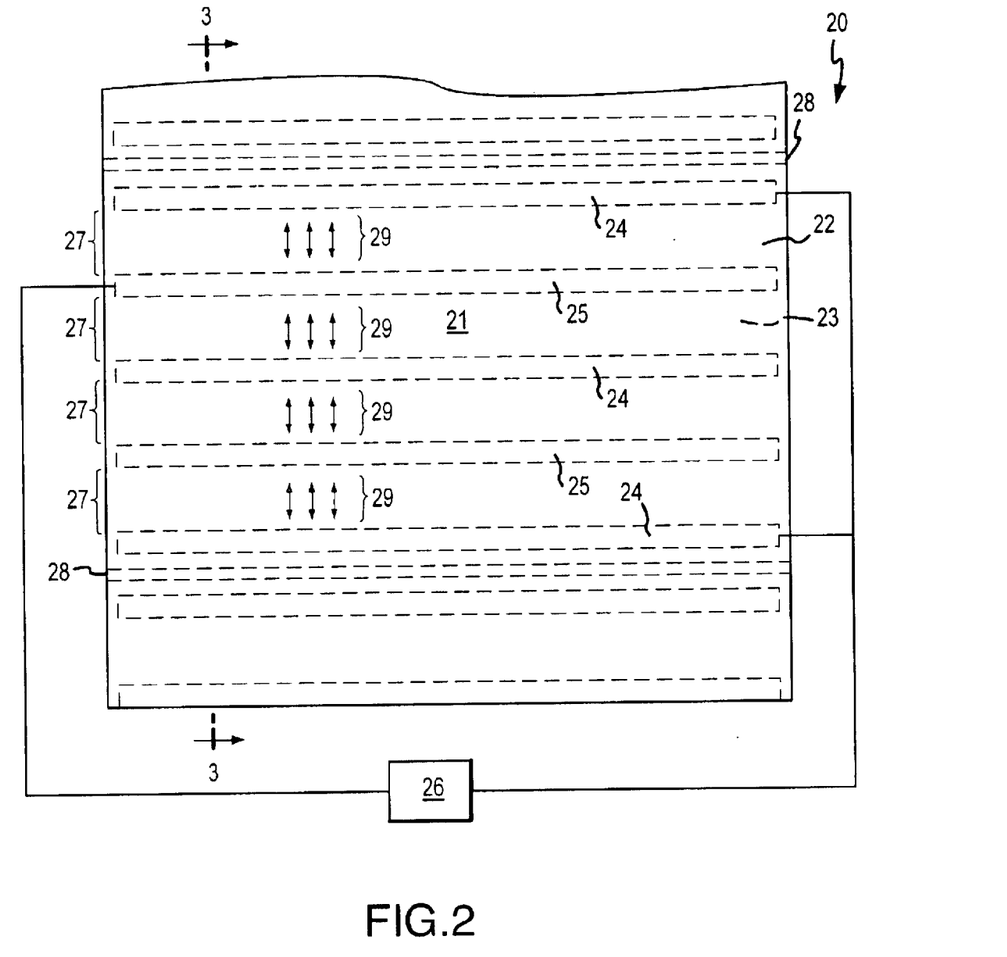
FIG. 2 is a partial plan view of a micro-formed membrane transducer according to an embodiment of the invention.

FIG. 2 is a partial plan view of a micro-formed membrane transducer 20 according to an embodiment of the invention. The transducer 20 includes a planar member 21 that has an upper side 22 and an opposing lower side 23. The planar member 21 is a layered structure that includes at least one layer of a piezoelectric material (not shown). The structure of the planar member 21 will be discussed in greater detail below. A plurality of spaced-apart first electrodes 24 and second electrodes 25 are fixedly attached to the lower side 23 of the planar member 21, and are further electrically coupled to the piezoelectric material. Although the first electrodes 24 and the second electrodes 25 are shown spaced apart at approximately equal intervals, it is understood that the spacing of the first electrodes 24 and the second electrodes 25 may be positioned at varying intervals across the lower side 23 of the planar member 21. The first electrodes 24 and second electrodes 25 are further coupled to an ultrasound system 26 capable of applying a time varying excitation voltage between the first electrodes 24 and second electrodes 25, so that a time-varying electric field 29 is generated. The piezoelectric material included in the planar member 21 is poled to exhibit vibratory motion in a lateral direction that is generally transverse to the orientation of the first electrodes 24 and the second electrodes 25 ($k_{33}$ mode), so that the piezoelectric material exhibits a time varying lateral strain in the direction of the field 29 in response to the applied excitation voltage. Since the first electrodes 24 and the second electrodes 25 are positionally fixed relative to an underlying structure, as will be described in more detail below, the planar member 21 exhibits flexural displacements in membrane portions 27 between the electrodes 24 and 25 that extend in a direction that is generally perpendicular to the surface 22 of the planar member 21, thus causing acoustic waves to radiate outwardly from the surface 22. Correspondingly, a displacement of membrane portions 27 occurring when reflected acoustic signals are impressed upon the membrane portions 27, cause the piezoelectric material to be strained in a direction parallel to the surface 22, thus generating a time varying signal that may be processed by the ultrasound system 26.

Still referring to FIG. 2, the planar member 21 further includes separations 28 that extend at least partially into the member 21 (and typically fully through the member) from the lower side 23 to electrically and acoustically decouple the transducer 20 from other adjacent transducers in an array.

Figure 3:
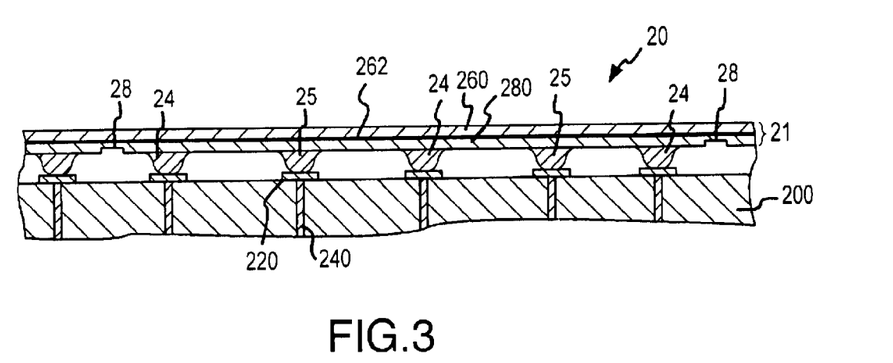
FIG. 3 is a partial cross sectional view of a micro-formed membrane transducer according to an embodiment of the invention.

FIG. 3 is a partial cross sectional view of the membrane transducer 20 along the section line 3—3 shown in FIG. 2. The planar member 21 includes a continuous upper layer 260 that is comprised of a hard, chemically resistant material such as silicon nitride, aluminum oxide, magnesium oxide or chemical vapor deposited (CVD) diamond. A piezoelectric layer 280 is positioned adjacent to the upper layer 260 and may be comprised of ceramic lead titanate (PT) or lead zirconate titanate (PZT) that may be optionally doped with La, Mn, Fe, Sb, Sr or Ni, or any combination of these elements. The layer 280 may also be comprised of $Pb(Mg_{1/3}Nb_{2/3})O_3$—$PbTiO_3$ that may be optionally doped with La, Mn, Fe, Sb, Sr or Ni, or any combination of these elements. Still further, the layer 280 may be comprised of any of the following compounds: $Pb(Ni_{1/3}Nb_{2/3})O_3$—$PbTiO_3$; $Pb(Sc_{1/2}Nb_{1/2})O_3$—$PbTiO_3$; $Pb(Zn_{1/3}Nb_{2/3})_{1-x-y}(Mn_{1/2}Nb_{1/2})_xTi_yO_3$, where ($0 \leq x \leq 1$) and ($0 \leq y \leq 1$), $Pb(In_{1/2}Nb_{1/2})O_3$—$PbTiO_3$; $PbY_{1/2}Nb_{1/2}O_3$—$PbTiO_3$; $PbZn_{1/3}Nb_{2/3}O_3$—$PbTiO_3$ that may be optionally doped with La, Mn, Fe, Sb, Sr or Ni, or any combination of these elements, $Sr_3TaGa_3Si_2O_{14}$; $K(Sr_{1-x}Ba_x)_2Nb_5O_{15}$, where ($0 \leq x \leq 1$); $Na(Sr_{1-x}Ba_x)_2Nb_5O_{15}$, where ($0 \leq x \leq 1$); $BaTiO_3$; $(K_{1-x}Na_x)NbO_3$, where ($0 \leq x \leq 1$); $(Bi,Na,K,Pb,Ba)TiO_3$; $(Bi,Na)TiO_3$; $Bi_7Ti_4NbO_{21}$; $(K_{1-x}Na_x)NbO_3$—$(Bi,Na,K,Pb,Ba)TiO_3$, where ($0 \leq x \leq 1$); $a(Bi_xNa_{1-x})TiO_{3-b}(KNbO_{3-c})\frac{1}{2}(Bi_2O_3$—$Sc_2O_3)$, where ($0 \leq x \leq 1$) and ($a+b+c=1$); $(Ba_aSr_bCa_c)Ti_xZr_{1-x}O_3$, where ($0 \leq x \leq 1$) and ($a+b+c=1$); $(Ba_aSr_bLa_c)Bi_4Ti_4O_{15}$, where ($a+b+c=1$); $Bi_4Ti_3O_{12}$; $LiNbO_3$; $La_3Ga_{5.5}Nb_{0.5}O_{14}$; $La_3Ga_5SiO_{14}$; $La_3Ga_{5.5}Ta_{0.5}O_{14}$; AlN; ZnO or a textured film of lead zirconate titanate (PZT) that may be optionally doped with La, Mn, Fe, Sb, Sr, Ni or any combination of these elements, a textured film of lead magnesium niobate-lead titanate (PMN-PT) that may be optionally doped with La, Mn, Fe, Sb, Sr, Ni or any combination of these elements, a textured film of lead zinc niobate-lead titanate (PZN-PT) that may be optionally doped with La, Mn, Fe, Sb, Sr, Ni or any combination of these elements, single crystal PMN-PT, single crystal PZN-PT, polyvinylidene fluoride polymers (PVDF) or other suitable alternative piezoelectric materials.

Still referring to FIG. 3, a thin anti-reaction layer 262 may be interposed between the piezoelectric layer 280 and the upper layer 260 to chemically isolate the piezoelectric layer 280 from the upper layer 260 during formation of the planar member 21. The anti-reaction layer 262 may be comprised of $TiO_2$, $ZrO_2$, MgO, $Al_2O_3$, $HfO_2$, $ZrTiO_4$, $LaAlO_3$ or any combination of these compounds, although other compounds may also be used. Still referring to FIG. 3, a seeding layer may be interposed between the piezoelectric layer 280 and the anti-reaction layer 262. The seeding layer may comprise highly textured MgO, AlN, $LaAlO_3$, $PbZr_xTi_{1-x}O_3$, Pt(111) or Pt(100), Pt (111)/Ti, $La_{1-x}Sr_xCoO_3$. The first electrodes 24 and the second electrodes 25 are comprised of a conductive material, which may include a Ti or $Ti_{1-x}W_x$ ($0 \leq x \leq 1$) alloy interface layer and a conductive layer of aluminum, aluminum doped with silicon or aluminum doped with copper, gold, platinum, although other conductive materials may also be used. The first electrodes 24 and the second electrodes 25 extend downwardly from the piezoelectric layer 280 to join a plurality of conductive contact pads 220 that are deposited on an acoustic backing member 200. The contact pads 220 may be comprised of gold, platinum, aluminum or still other conductive materials and may include similar interface layers. The first electrodes 24 and the second electrodes 25 are fixedly bonded to the contact pads 220 by compression bonding or soldering the first electrodes 24 and the second electrodes 25 to the pads 220 to form a relatively rigid mechanical connection between the first electrodes 24 and the pads 220, and the second electrodes 25 and the pads 220. Alternatively, either conductive or non-conductive epoxy compounds or other adhesives may be used to bond the first electrodes 24 and the second electrodes 25 to the pads 220. The contact pads 220 are further electrically coupled to a plurality of conduction members 240 that extend through the acoustic backing member 200 to provide a continuous conductive path coupling each of the first electrodes 24 and second electrodes 25 to the ultrasound system 26 (as shown in FIG. 2). The acoustic backing member 200 may be comprised of any suitable material having relatively high acoustic attenuation and appropriately selected low acoustic impedance that also provides a relatively rigid structural support for the planar member 21, the first electrodes 24 and second electrodes 25. Examples of suitable materials include various epoxy resins or epoxy matrices with dispersed solid metallic, ceramic, or polymer particles.

Figure 4:
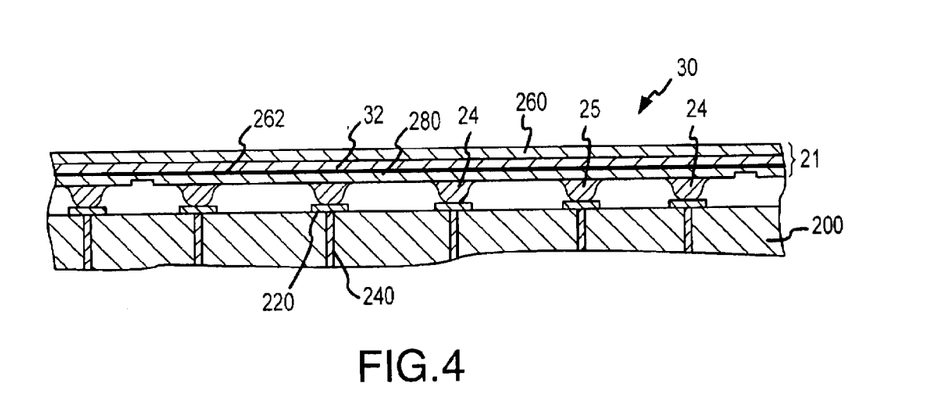
FIG. 4 is a partial cross sectional view of a micro-formed membrane transducer according to another embodiment of the invention.

FIG. 4 is a partial cross sectional view of a membrane transducer 30 according to another embodiment of the invention. The planar member 21 includes an upper layer 260, comprised of a hard, chemically resistant material that may include any of the materials previously identified, in addition to other alternative materials. The piezoelectric layer 280 may similarly be comprised of the previously described materials. An intermediate layer 32 is interposed between the upper layer 260 and the piezoelectric layer 280 to space the layer 280 away from the upper layer 260. Separating the upper layer 260 from the piezoelectric layer 280 advantageously increases the uniformity of the flexural stresses in the piezoelectric layer 280, thus improving the coupling coefficient of the device. The intermediate layer 32 is generally a more flexurally compliant layer than the upper layer 260 or the piezoelectric layer 280, and may be comprised, for example, of silicon dioxide, or silicon oxynitride, although other materials may also be used. An anti-reaction layer 262 may optionally be deposited on a surface of the piezoelectric layer 280 that adjoins the layer 32. The anti-reaction layer 262 may be comprised of any of the materials previously identified, in addition to other alternative materials.

Figure 4A:
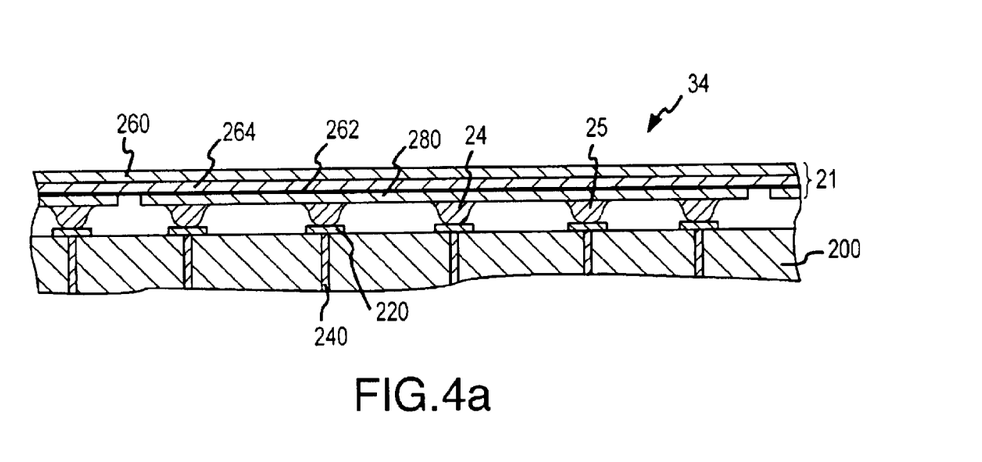
FIG. 4a is a partial cross sectional view of a micro-formed membrane transducer according to still another embodiment of the invention.

FIG. 4a is a partial cross sectional view of a membrane transducer 34 according to another embodiment of the invention. The planar member 21 includes an upper layer 260 that is comprised of a hard, chemically resistant material that may include any of the materials previously identified, in addition to other alternative materials. The piezoelectric layer 280 may similarly be comprised of the previously described materials, in addition to other alternative materials. The membrane transducer 34 further includes a barrier layer 264 positioned between the upper layer 260 and the piezoelectric layer 280. The barrier layer 264 generally inhibits the chemical interaction of the piezoelectric layer 280 with certain materials used in the upper layer 260 during the formation of the planar member 21. For example, undesirable compounds may be developed during formation of the planar member 21 where the material comprising the upper layer 260 includes CVD diamond, or like materials. Accordingly, the barrier layer 264 may be comprised of silicon nitride, silicon oxide, silicon oxynitride or aluminum nitride, or combinations of these compounds. An anti-reaction layer 262 may be optionally interposed between the piezoelectric layer 280 and the barrier layer 264 to further inhibit chemical interaction between the piezoelectric layer 280 and the barrier layer 264. The anti-reaction layer 262 may be comprised of any of the previously identified materials, in addition to other alternative materials.

Figure 4B:
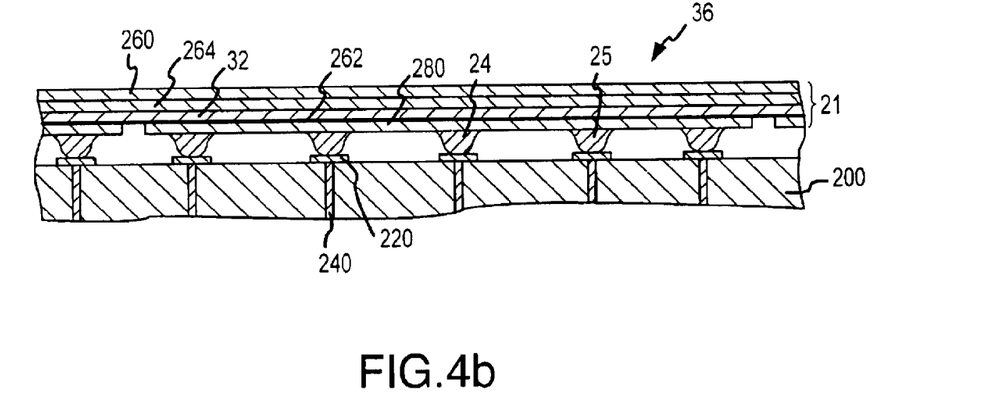
FIG. 4b is a partial cross sectional view of a micro-formed membrane transducer according to yet another embodiment of the invention.
Figure 5:
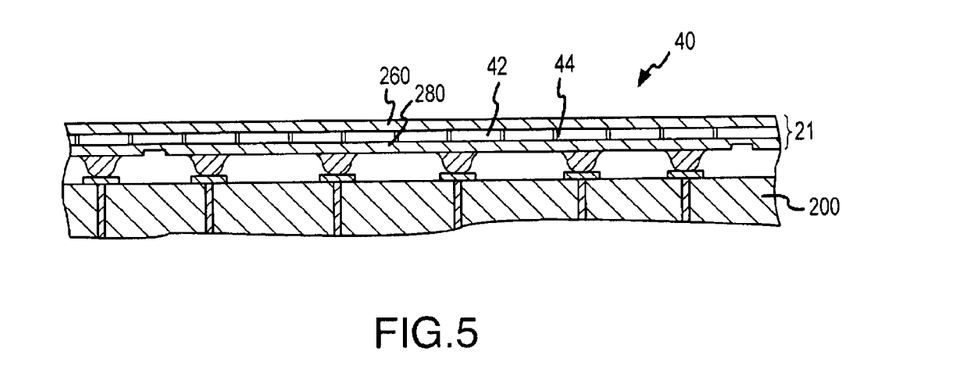
FIG. 5 is a partial cross sectional view of a micro-formed membrane transducer according to still yet another embodiment of the invention.

FIG. 4b is a partial cross sectional view of a membrane transducer 36 according to another embodiment of the invention. The planar member 21 includes an upper layer 260, which may include any of the materials previously identified, in addition to other alternative materials, and a piezoelectric layer 280, which may similarly be comprised of the previously described materials, in addition to other alternative materials. An intermediate layer 32 may be positioned between the upper layer 260 and the piezoelectric layer 280 at a location adjacent to the piezoelectric layer 280 to enhance the acoustic coupling coefficient for the transducer 36, as described more fully above. An anti-reaction layer 262 may optionally be interposed between the intermediate layer 32 and the piezoelectric layer 280 to further inhibit chemical interaction between the piezoelectric layer 280 and adjacent layers, as earlier described. Further, the transducer 36 may also include a barrier layer 264 that is positioned between the upper layer 260 and the intermediate layer 32 to chemically isolate the upper layer 262 from the intermediate layer 32. FIG. 5 is a partial cross sectional view of a membrane transducer 40 according to another embodiment of the invention. The planar member 21 includes a hard, chemically resistant upper layer 260, as in the foregoing embodiments. The piezoelectric layer 280 may similarly be comprised of the previously described materials. An intermediate layer 42 is interposed between the upper layer 260 and the piezoelectric layer 280 to space the layer 280 away from the upper layer 260. The intermediate layer 42 is comprised of a plurality of spacing elements 44 that extend between the piezoelectric layer 280 and the upper layer 260 to separate the upper layer 260 from the piezoelectric layer 280 in order to enhance the coupling coefficient of the transducer 40. For example, the spacing elements 44 may be comprised of columnar structures formed by depositing a layer of $SiO_2$ on the upper layer 260, and subsequently removing a portion of the deposited layer to form the columnar structures.

The foregoing embodiments of the invention permit an acoustic backing member to be positioned behind the array, thus advantageously reducing ultrasonic energy losses through the rear surfaces of the transducers thus enabling transducers to be produced having greater sensitivity. Further, cross-coupling between transducers in an array are reduced by the presence of the backing structure, thus permitting the formation of arrays that are less susceptible to "cross-talk" and other forms of interference.

Still other advantages are present in the foregoing embodiments. For example, since the transducer is positioned on a acoustic backing member that is comprised of a generally resilient material, the transducer is able to absorb physical impacts without sustaining damage, since the foregoing embodiments do not have the hard, fragile underlying substrate present in prior art devices. The foregoing embodiments further provide a non-porous, chemically inert and uniformly planar member that substantially covers the transducer to prevent the migration of contaminants such as sterilants, or coupling gels into the structure of the transducer.

Figure 6:
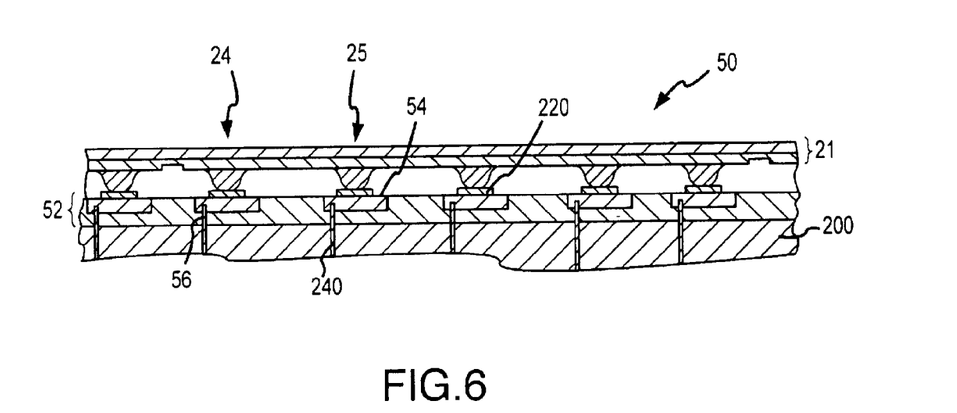
FIG. 6 is a partial cross sectional view of a micro-formed membrane transducer according to a further embodiment of the invention.

FIG. 6 is a partial cross sectional view of a membrane transducer 50 according to yet another embodiment of the invention. A substrate 52 is positioned on the acoustic backing member 200 that includes a plurality of active circuits 54 that are formed monolithically in the substrate 52 and passive functions such as capacitors, resistors, or inductors. The passive functions are either realized in or on the semiconductor substrate 52. The passive functions can also be processed on a separate substrate, which is wire-bonded or flip-chip mounted to the semiconductor substrate 52. The separate substrate with the passive functions can be a Si-substrate or a ceramic substrate with integrated capacitors, inductors, or resistors as well as interconnects. The substrate can also be a laminate type substrate with integrated passive functions such as capacitors, inductors, or resistors. The substrate 52 further includes a plurality of contact pads 220 that electrically couple the first electrodes 24 and the second electrodes 25 to the active and passive circuits. The active and passive circuits are further electrically coupled to the plurality of conduction members 240 by a plurality of conductive vias 56 that project into the substrate 52 to form interconnections between the members 240 and the active and passive circuits. The active circuits 54 may be comprised of a simple semiconductor device, such as a field effect transistor (FET), or a metal oxide field effect transistor (MOSFET) that control the operation of the transducer 50, or alternatively, the circuits 54 may be more highly integrated circuits that perform at least a portion of the signal processing functions of the ultrasound system 26 (as shown in FIG. 2). For example, the active and passive circuits may include circuits that at least partially perform array beamforming operations. Moreover, the active and passive circuits may perform still other functions, such as performing multiplexing operations, or other "front end" operations related to the transmission or reception of signals by the transducer 50.

Figure 7:
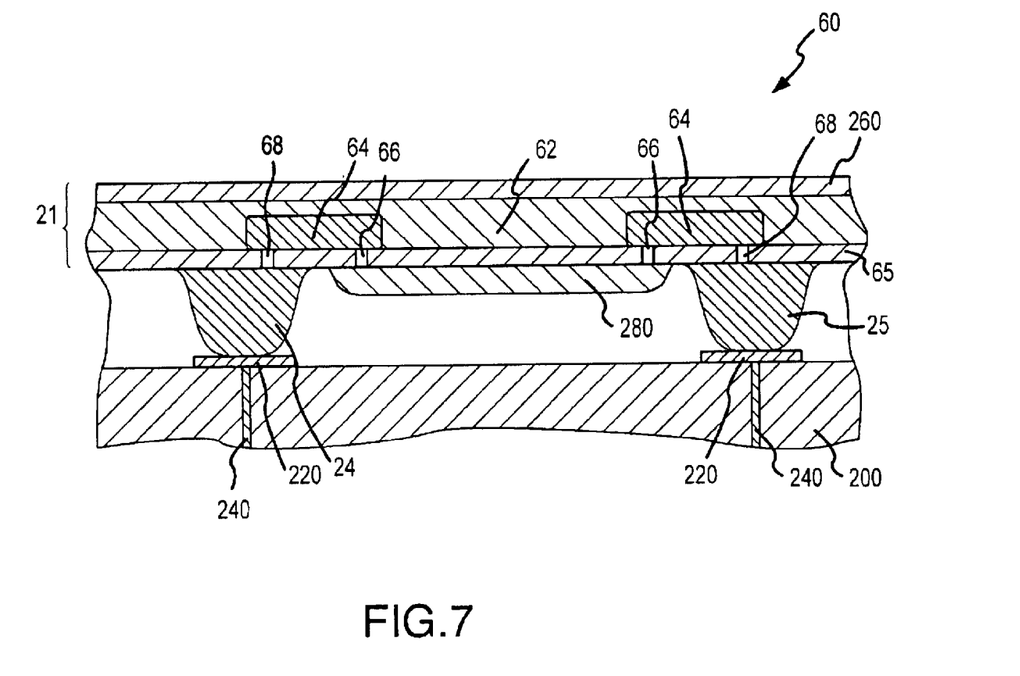
FIG. 7 is a partial cross sectional view of a step in a method for forming a micro-formed membrane transducer according to an embodiment of the invention.

FIG. 7 is a partial cross sectional view of a membrane transducer 60 according to yet still another embodiment of the invention. The planar member 21 includes an upper layer 260, a piezoelectric layer 280, and a semiconductor substrate layer 62 interposed between the upper layer 260 and the piezoelectric layer 280. The substrate layer 62 further includes a plurality of active circuits 64 monolithically formed in the substrate layer 62. As in the previous embodiment, the circuits 64 may be comprised of FETs or MOSFETs to control the operation of the transducer 60, or the circuits 64 may be comprised of more highly integrated active and passive devices that may perform at least a portion of the signal processing functions of the ultrasound system 26 (as shown in FIG. 2). The active circuits 64 are coupled to the piezoelectric layer 280 by vias 66 that extend through an insulating layer 65 formed on the substrate layer 62. The active circuits 64 are further coupled to the first electrodes 24 and the second electrodes 25 by vias 68 that extend through insulating layer 65. The insulating layer 65 may be comprised of a suitable insulating material, such as a silicon dioxide layer formed on the surface of the semiconductor substrate layer 62.

The foregoing embodiments advantageously allow a plurality of active semiconductor circuits to be integrated into the structure of the transducer. The circuits may perform a variety of preliminary signal processing functions, thereby relieving the ultrasound system of at least a portion of the overall signal processing demand.

Figure 8:
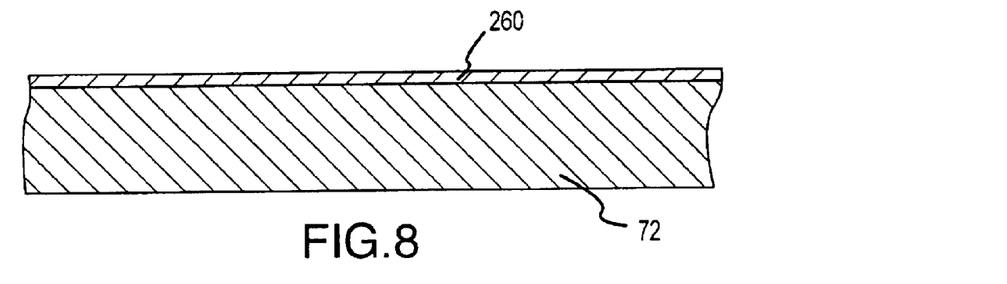
FIG. 8 is a partial cross sectional view of a step in a method for forming a micro-formed membrane transducer according to an embodiment of the invention.

FIGS. 8 through 16 are partial cross sectional views of steps in a method for forming a micro-formed membrane transducer according to an embodiment of the invention. Referring first to FIG. 8, an upper layer 260 is deposited or formed on an underlying silicon substrate 72, and may be comprised of a suitably stiff, yet low-density material. For example, the upper layer 260 may be comprised of a silicon nitride film that is deposited on the silicon substrate 72 by low-pressure chemical vapor deposition (LPCVD). Alternatively, the upper layer 260 may be comprised of a diamond material that is deposited by chemical vapor deposition (CVD) methods.

Figure 9:
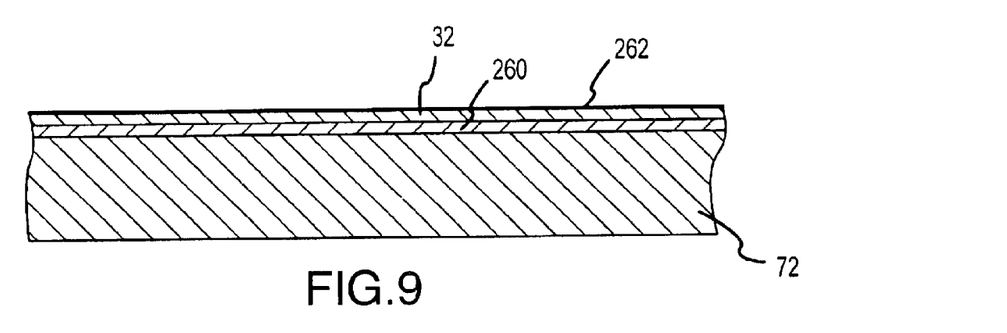
FIG. 9 is a partial cross sectional view of a step in a method for forming a micro-formed membrane transducer according to an embodiment of the invention.

Referring now to FIG. 9, an intermediate layer 32 may optionally be deposited on the upper layer 260. In a disclosed embodiment, the intermediate layer 32 is comprised of silicon dioxide or silicon oxynitride, which may be formed on the upper layer 260 by LPCVD processes, or by still other processes well known in the art. Additionally, an anti-reaction layer 262 may optionally be formed on the intermediate layer 32 by various known processes. For example, when the layer 262 is comprised of titanium dioxide, the layer 262 may be deposited by sputtering the titanium dioxide onto the layer 32. Alternatively, titanium may be sputtered onto the layer 32 and subjected to a thermal oxidation process to form the anti-reaction layer 262. Still further, other materials and deposition processes may be used to form the layer 262.

Figure 10:
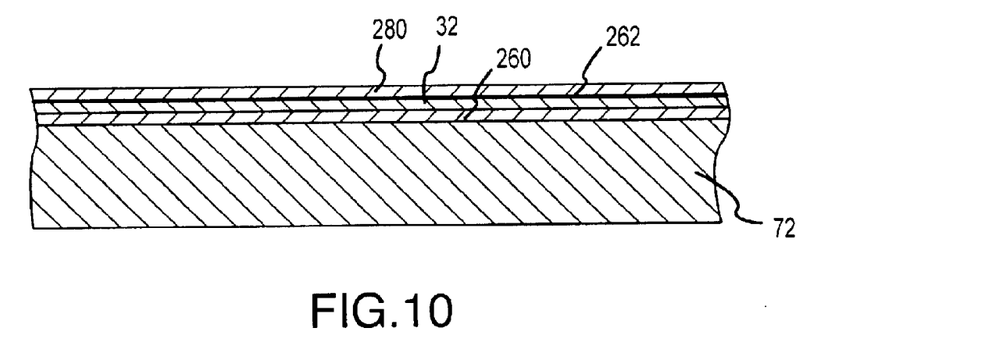
FIG. 10 is a partial cross sectional view of a step in a method for forming a micro-formed membrane transducer according to an embodiment of the invention.

Turning now to FIG. 10, a piezoelectric layer 280 is applied to the intermediate layer 32 and the anti-reaction layer 262. In one aspect, the layer 280 may be comprised of PZT or donor or acceptor-doped PZT that is deposited onto the layer 32 by a sol-gel process. Sol-gel processes are well-known methods for the production of doped or undoped PZT, particularly in a thin layer form, and are advantageous in that a thin layer of PZT having high purity can be formed having a high surface smoothness. Other well-known methods, such as sputtering or chemical vapor deposition (CVD), may also be used to apply the piezoelectric layer 280. The piezoelectric layer 280 may also be comprised of a textured thin film of doped or undoped PZT that advantageously exhibits a nearly single crystal structure. Further, textured, doped or undoped lead magnesium niobate-lead titanate (PMN-PT) or textured, doped or undoped lead zinc niobate-lead titanate (PZN-PT) may also be used, which advantageously exhibit higher coupling coefficients and permit the generation of induced strains that are an order of magnitude greater than those obtainable using PZT at a modest electric field strength. Following the formation of the piezoelectric layer 28, the layer may be poled to establish the desired $k_{33}$ polarization properties, as is well-known in the art. To grow textured films a seeding layer may be deposited by sol-gel processes or sputtering or chemical vapor deposition (CVD). The seeding layer may comprise highly textured $MgO$, $AlN$, $LaAlO_3$, $PbZr_xTi_{1-x}O_3$, $Pt(111)$ or $Pt(100)$, $Pt$ $(111)/Ti$, $La_{1-x}Sr_xCoO_3$.

Figure 11:
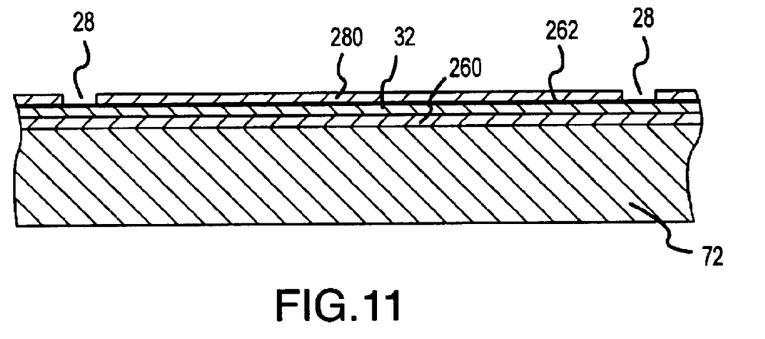
FIG. 11 is a partial cross sectional view of a step in a method for forming a micro-formed membrane transducer according to an embodiment of the invention.

Referring now to FIG. 11, separations 28 may be formed in the piezoelectric layer 280 by applying a photo resist material (not shown) and exposing the photo resist material by photolithographic methods. Development of the exposed photo resist results in a patterned structure (also not shown) that permits an etchant to etch the separations 28. Etchants that may be used to etch the layer 280 may include acetic acid-nitric acid solutions, or acetic acid-nitric acid-hydroflouric acid solutions, although other alternatives exist. Following the etching process, the photo resist may be stripped from the piezoelectric layer 280 by well-known processes to produce the separations 28 shown in FIG. 11. Alternatively, other etching solutions or methods may be employed to form the separations 28 that extend beyond the piezoelectric layer 280.

Figure 12:
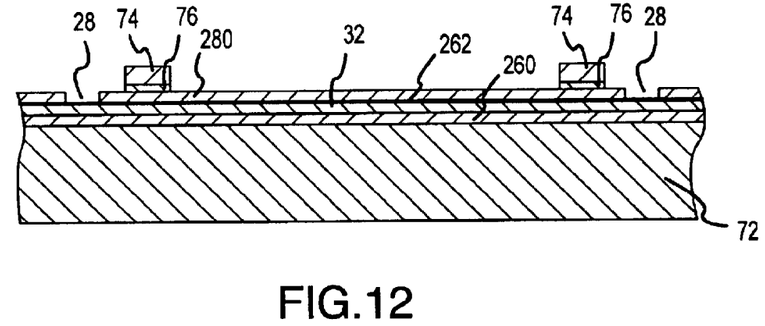
FIG. 12 is a partial cross sectional view of a step in a method for forming a micro-formed membrane transducer according to an embodiment of the invention.

FIG. 12 shows a plurality of first metal structures 74 positioned on the piezoelectric layer 280, each having an interface layer 76 interposed between the first metal structure 74 and the piezoelectric layer 280. The first metal structure 74 is comprised of a conductive material, which may include gold, aluminum, or platinum, although other suitable materials may also be used. The interface layer 76 is similarly comprised of a conductive material, which may include chromium, nichrome, titanium, or $Ti_{1-x}W_x$ ($0 \leq x \leq 1$) which assists in bonding the first metal structures 74 to the layer 280. The plurality of first metal structures 74 and interface layers 76 may be formed on the surface of the piezoelectric layer 280 by deposition of the metal layers 74 and interface layers 76. For example, evaporation, sputtering, or CVD metal deposition methods may be used. Patterning of the metal layers is carried out by deposition of photoresist, developing the photoresist to form a pattern, and subsequent etching of the metal by wet-chemical or dry-etching procedures.

Alternatively patterning of the layers 74 and 76 can be achieved by patterning a layer of photoresist (not shown) and developing the photoresist to form openings (also not shown) to deposit the respective material onto the layer 280. The layers 74 and 76 may be deposited by well known methods. For example vacuum deposition, sputtering or CVD by be used.

Figure 13:
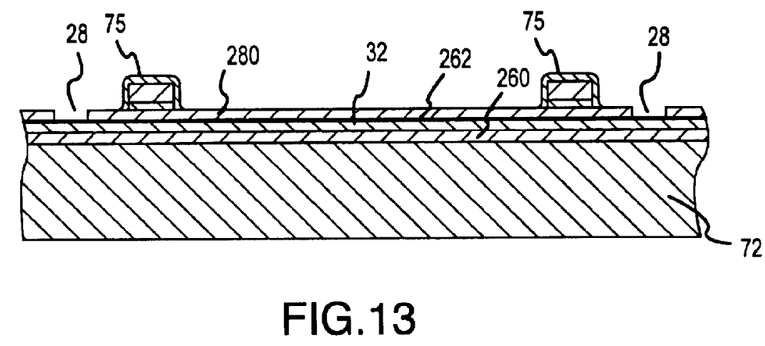
FIG. 13 is a partial cross sectional view of a step in a method for forming a micro-formed membrane transducer according to an embodiment of the invention.

Turning now to FIG. 13, a plurality of second metal structures 75 are deposited onto the first metal structures 74 and the interface layers 76. The second metal structures 75 may be comprised of a conductive material, which may include gold platinum, a Ti/Au or a Ti/Pt alloy, although other conductive materials may be used. The second metal structures 75 may be applied by evaporation, sputtering, or CVD. Patterning of the metal layer is carried out by deposition of photoresist, developing the photoresist to form a pattern and subsequently etching of the metals by wet-chemical or dry-etching procedures.

Figure 14:
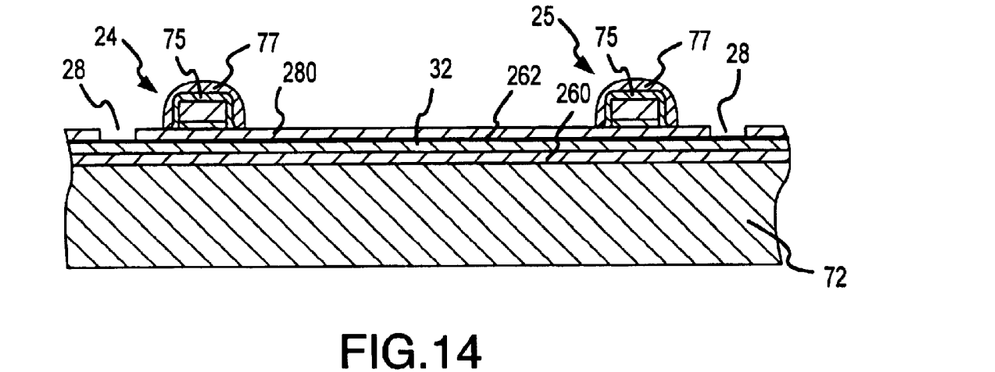
FIG. 14 is a partial cross sectional view of a step in a method for forming a micro-formed membrane transducer according to an embodiment of the invention.
Figure 15:
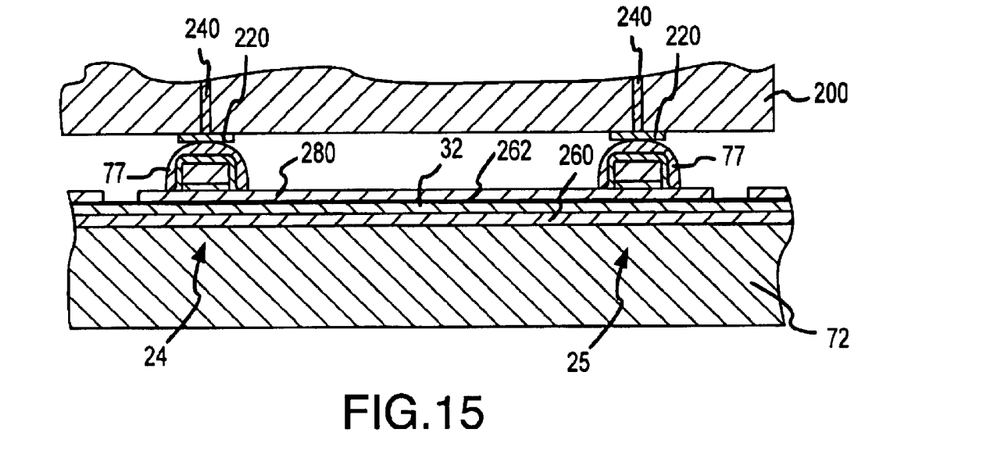
FIG. 15 is a partial cross sectional view of a step in a method for forming a micro-formed membrane transducer according to an embodiment of the invention.

Referring now to FIGS. 14 and 15, a cover layer 77 may be deposited on the second metal structures 75 to form the plurality of first electrodes 24 and second electrodes 25, as shown in FIG. 14. The cover layer 77 may be comprised of a conductive material, which may include gold, platinum, a Ti/Au alloy or a Ti/Pt alloy, although other conductive materials may also be used. The resulting structure may then be presented to the acoustic backing member 200, as shown in FIG. 15. The first electrodes 24 and the second electrodes 25 may then be electrically and mechanically coupled to the contact pads 220 on the member 200 by a number of well-known methods. For example, the first electrodes 24 and the second electrodes 25 may be bonded to the contact pads 220 by soldering the electrodes 24 and 25 to the pads 220. Alternatively, either conductive or non-conductive epoxy compounds or other adhesives may also be employed to bond the first electrodes 24 and the second electrodes 25 to the pads 220. Still further, a compression bonding method may be used whereby a thin layer of a metal, such as indium, is positioned between each of the electrodes 24 and 25 and the contact pads 220 followed by the application of a mechanical force to form a mechanical and electrical bond between the electrodes 24 and 25 and the pads 220.

Figure 16:
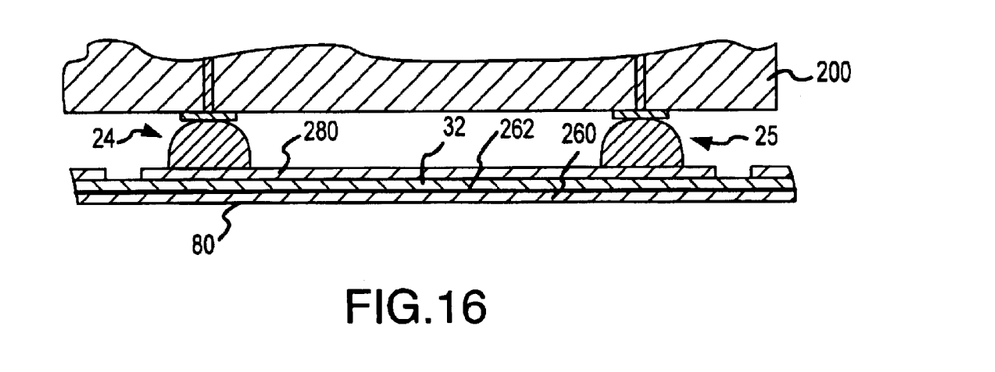
FIG. 16 is a partial cross sectional view of a step in a method for forming a micro-formed membrane transducer according to an embodiment of the invention.

Following the bonding of the first electrodes 24 and the second electrodes 25 to the pads 220, the substrate 72 may be removed, as shown in FIG. 16. The substrate 72 may be removed by back grinding the substrate 72 until a surface 80 of the upper layer 260 is exposed. The back grinding operation removes substantially all of the substrate material so that the planar member 21 and the plurality of first electrodes 24 and second electrodes 25 remain. The substrate 72 may also be removed by other well-known methods. For example, the substrate 72 may be removed by etching the material to expose the surface 80. Alternatively, a combination of back grinding and etching may also be employed.

The foregoing embodiment discloses steps of a method to fabricate a micro-formed membrane transducer. The disclosed steps may advantageously be implemented using semiconductor fabrication methods and equipment that are well-known and relatively inexpensive to implement. Further, the structures shown in the disclosed steps may conveniently be produced by an outside wafer fabrication provider, which may lead to still further cost savings.

The above description of illustrated embodiments of the invention is not intended to be exhaustive or to limit the invention to the precise form disclosed. While specific embodiments of, and examples of, the invention are described in the foregoing for illustrative purposes, various equivalent modifications are possible within the scope of the invention, as those skilled within the relevant art will recognize. Moreover, the various embodiments described above can be combined to provide further embodiments. Accordingly, the invention is not limited by the disclosure, but instead the scope of the invention is to be determined entirely by the following claims.

What is claimed is:

1. A micro-formed ultrasonic membrane transducer, comprising:

a planar member having a layer of a piezoelectric material formed therein;

a plurality of spaced apart electrodes disposed on a surface of the planar member and coupled to the layer of piezoelectric material for applying an electric field to the layer to flex selected portions of the planar member; and an acoustic backing member fixedly joined to the plurality of electrodes.

2. The transducer according to claim 1 wherein the planar member is further comprised of an upper layer supported by the piezoelectric layer.

3. The transducer according to claim 2 wherein the planar member is further comprised of an intermediate layer interposed between the upper layer and the piezoelectric layer.

4. The transducer according to claim 2 wherein the planar member is further comprised of an anti-reaction layer interposed between the upper layer and the piezoelectric layer.

5. The transducer according to claim 1 wherein the plurality of spaced apart electrodes is further comprised of a plurality of elongated electrodes that are approximately parallel and extend across the surface.

6. The transducer according to claim 5 wherein the plurality of elongated electrodes are uniformly spaced apart.

7. The transducer according to claim 6 wherein the selected portions of the planar member are further comprised of membrane portions that extend between the electrodes.

8. The transducer according to claim 1 wherein the acoustic backing member is further comprised of a plurality of contact pads fixedly joined to the electrodes.

9. The transducer according to claim 8 wherein the acoustic backing member is further comprised of a plurality of conductive members coupled to the contact pads that extend through the acoustic backing member.

10. The transducer according to claim 2 wherein the upper layer is comprised of silicon nitride.

11. The transducer according to claim 2 wherein the upper layer is comprised of chemical vapor deposited diamond.

12. The transducer according to claim 3 wherein the intermediate layer is comprised of silicon dioxide.

13. The transducer according to claim 3 wherein the intermediate layer is comprised of a plurality of columnar supports that extend between the upper layer and the piezoelectric layer.

14. The transducer according to claim 4 wherein the barrier layer is comprised of a material selected from the group consisting of silicon nitride, silicon oxide, silicon oxynitride and aluminum nitride and any combination of these compounds.

15. The transducer according to claim 1 wherein the layer of a piezoelectric material is selected from the group consisting of lead titanate (PT) that may be doped with La, Mn, Fe, Sb, Sr, Ni and any combination of these elements, lead zirconate titanate (PZT) that may be doped with La, Mn, Fe, Sb, Sr, Ni and any combination of these elements, $Pb(Mg_{1/3}Nb_{2/3})O_3$—$PbTiO_3$ that may be optionally doped with La, Mn, Fe, Sb, Sr or Ni, or any combination of these elements, polyvinylidene fluoride polymer (PVDF), $Pb(Ni_{1/3}Nb_{2/3})O_3$—$PbTiO_3$, $Pb(Sc_{1/2}Nb_{1/2})O_3$—$PbTiO_3$, $Pb(Zn_{1/3}Nb_{2/3})_{1-x-y}(Mn_{1/2}Nb_{1/2})_xTi_yO_3$, where $(0 \leq x \leq 1)$ and $(0 \leq y \leq 1)$, $Pb(In_{1/2}Nb_{1/2})O_3$—$PbTiO_3$, $PbY_{1/2}Nb_{1/2}O_3$—$PbTiO_3$; $Sr_3TaGa_3Si_2O_{14}$, $K(Sr_{1-x}Ba_x)_2Nb_5O_{15}$, where $(0 \leq x \leq 1)$, $Na(Sr_{1-x}Ba_x)_2Nb_5O_{15}$ where $(0 \leq x \leq 1)$, $BaTiO_3$, $(K_{1-x}Na_x)NbO_3$ where $(0 \leq x \leq 1)$, $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ where $(0 \leq x \leq 1)$, $a(Bi_xNa_{1-x})TiO_{3-b}(KNbO_{3-c})\frac{1}{2}(Bi_2O_3$—$Sc_2O_3)$ where $(0 \leq x \leq 1)$ and $(a+b+c=1)$, $(Ba_aSr_bCa_c)Ti_xZr_{1-x}O_3$ where $(0 \leq x \leq 1)$ and $(a+b+c=1)$, $(Ba_aSr_bLa_c)Bi_4Ti_4O_{15}$ where $(a+b+c=1)$, $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$, AlN, ZnO, or lead zinc niobate-lead titanate (PZN-PT) that may be optionally doped with La, Mn, Fe, Sb, Sr or Ni, or any combination of these elements.

16. The transducer according to claim 1 wherein the layer of a piezoelectric material is selected from the group consisting of a textured thin film of lead zirconate titanate (PZT) that may include La, Mn, Fe, Sb, Sr, Ni and any combination of these elements as a dopant, a textured thin film of lead magnesium niobate-lead titanate (PMN-PT) that may include La, Mn, Fe, Sb, Sr, Ni and any combination of these elements as a dopant, and a textured thin film of lead zinc niobate-lead titanate (PZN-PT) that may include La, Mn, Fe, Sb, Sr, Ni and any combination of these elements as a dopant.

17. The transducer according to claim 1 wherein the planar member is further comprised of an anti-reaction layer disposed under the layer of piezoelectric material.

18. The transducer according to claim 17 wherein the anti-reaction layer is selected from the group consisting of $TiO_2$, $ZrO_2$, MgO, $Al_2O_3$, $HfO_2$, $ZrTiO_4$, $LaAlO_3$ and any combination of these compounds.

19. The transducer according to claim 1 wherein the planar member is further comprised of a seeding layer disposed under the layer of piezoelectric material.

20. The transducer according to claim 19 wherein the seeding layer is selected from the group consisting of highly textured MgO, AlN, $LaAlO3$, $PbZr_xTi1-xO3$, Pt(111) or Pt(100), Pt (111)/Ti, and $La_{1-x}Sr_xCoO_3$ films.

21. The transducer according to claim 1 wherein the acoustic backing member is comprised of an epoxy resin that provides acoustic attenuation.

22. The transducer according to claim 1 wherein the acoustic backing member further comprises one or more filler materials.

23. The transducer according to claim 1 wherein the acoustic backing member is further comprised of a thin silicon layer having a plurality of active circuits formed monolithically therein, each active circuit being coupled to an electrode.

24. The transducer according to claim 1 wherein the planar member is further comprised of a thin silicon layer having a plurality of active circuits formed monolithically therein, each active circuit being coupled to an electrode and to the piezoelectric layer.

* * * * *